United States Patent [19]

DiBugnara

[11] 4,190,458

[45] Feb. 26, 1980

[54] METAL-SILICA SOLUTION FOR FORMING FILMS ON SEMICONDUCTOR SURFACES

[75] Inventor: Raymond DiBugnara, Huntington Beach, Calif.

[73] Assignee: TRW Inc., Los Angeles, Calif.

[21] Appl. No.: 890,810

[22] Filed: Mar. 27, 1978

Related U.S. Application Data

[62] Division of Ser. No. 741,793, Nov. 15, 1976, Pat. No. 4,126,713.

[51] Int. Cl.$^2$ .................................................. C09K 3/00
[52] U.S. Cl. ................................. 106/287.16; 427/88; 427/229
[58] Field of Search ................... 427/88, 95, 229, 125; 106/287.16; 260/448.8 A

[56] References Cited

U.S. PATENT DOCUMENTS

| | | | |
|---|---|---|---|
| 3,915,766 | 10/1975 | Pollack et al. | 106/287.16 |
| 3,997,501 | 12/1976 | McLeod | 106/1.17 |
| 4,014,703 | 3/1977 | Hayati et al. | 106/14.21 |

*Primary Examiner*—Lorenzo B. Hayes
*Attorney, Agent, or Firm*—Martin R. Horn

[57] ABSTRACT

An improved method for forming a metal-silica coating solution having particular utility in the formation of metal-organo-silicate films on semiconductor surfaces is disclosed. The method comprises the steps of forming a mixture of a first solution having a metal salt and a cross-linking agent dissolved therein and a second solution having an organo-silicate dissolved therein, and aging the mixture a predetermined length of time. This mixture can then be applied to the semiconductor surface where cross-linking takes place such that a viable film is formed. Further heating of the semi-conductor device causes a metal film to be formed which is in turn diffused into the semiconductor device. By the use of the metal-silica solution, an improved method for diffusing metal atoms into silicon for lifetime control is achieved.

5 Claims, No Drawings

METAL-SILICA SOLUTION FOR FORMING FILMS ON SEMICONDUCTOR SURFACES

This application is a division of Application Ser. No. 741,793 filed Nov. 15, 1976, now U.S. Pat. No. 4,126,713.

BACKGROUND OF THE INVENTION

1. Field of the Invention

This invention relates to improved methods for forming metal coating on various surfaces, and more specifically, to a method forming a film containing a gold compound or a platinum compound on a semiconductor surface.

2. Prior Art

The prior art is well aware of the use of semiconductor devices to implement electronic systems which semiconductor devices easily surpass the use of vacuum tubes. It is also well known in the prior art that there is a need that such devices possess high switching speeds and/or high current gain characteristics. In response to this need, the prior art has disclosed the use of gold to reduce the recovery time in, for example, diodes. In the past, gold was diffused through the body of the diode, the gold providing additional recombination centers in the silicon material. With the enhanced recombination of the minority carriers, the reverse recovery time of the diode is reduced.

One such method for diffusing metal atoms into silicon for lifetime control is disclosed by Ciccolella U.S. Pat. No. 3,067,485. In the method disclosed by Ciccolella, the silicon semiconductor body is coated with gold or a goldcontaining material, for example, by electroplating. The silicon is then heated at a temperature in the range from approximately 800 degrees centigrade to approximately 1300 degrees centigrade for a period of time sufficient to achieve substantially complete solid solubility of the gold in the silicon. Ciccolella further points out that in certain semiconductor devices it is desirable to limit or localize the gold treatment, and thus reduce the minority carrier lifetime within only a portion of the semiconductor body. This structure is achieved by using suitable masks or by controlling the depth of gold diffusion by limiting the time of diffusion. However, Ciccolella does not specifically describe how such electroplating techniques are employed, but suffice to say, that such electroplating techniques are well known in the art.

Other methods for depositing a metal film on a substrate in general are also well known in the art. For example, Fefferman U.S. Pat. No. 3,653,946 discloses a method for putting down an adherent gold film comprising the steps of mixing a gold resinate with at least two other specific resinates which, upon the decomposition in air or in an oxidizing atmosphere, form inorganic oxides. The resinate mixture is applied to the substrate and the substrate is fired to a temperature sufficient to decompose the resinate mixture to (1) form free gold and the inorganic oxides, (2) combine the inorganic oxides in situ on the surface of the substrate, and (3) combine the free gold with the combined oxides to form an adherent gold layer containing a high percentage by weight of gold. Such a system, however, requires the use of specific resinates and further requires that relatively high temperatures (approximately 2000 degrees F.) be used to form the gold layer.

Yet another method for applying a gold layer to a substrate is disclosed by Itoh et al U.S. Pat. No. 3,661,727. In Itoh et al, the method requires a gold chloride salt to be dissolved into an aqueous solution of water and hydrofluoric acid. When the surface, for example, a semi-conductor surface, is placed in such a solution, the silicon oxide layer on the top of such surface immediately begins to dissolve gradually by the hydrofluoric acid. Once the semiconductor surface is exposed, gold deposits on the surface of the silicon body. It is apparent from such method that very specific etchants must be used which etchants can adversely affect the semiconductor surface. Moreover, such method requires a pretreatment of the semiconductor surface so as to provide a silicon dioxide protective layer prior to the use of gold salt solution. Finally, such method plates on both sides of the wafer because of the immersion step and mechanical scrubbing is required to remove gold from the undesired areas. This method therefore, not only causes severe pitting of the silicon surface, it can also produce an uneven gold surface and requires the additional step of scrubbing.

The present invention is directed towards a method for supplying an easily applied source of metal atoms for diffusion into silicon for lifetime control. The present invention utilizes a specific solution which may be applied by brushing, spraying or spinning and which forms a metal silicate glass film on the surface of a semiconductor device without the need for extensive heating processes or strong etchants. Thus, the present invention provides an economical method for applying a metal-containing compound in the form of a film to a desired surface.

BRIEF SUMMARY OF THE INVENTION

The present invention relates to solutions used to form a metal-containing film on the surface of semiconductor devices, and methods for making such solutions. The invention will be described with reference to gold film and platinum film as these two metals have special attributes which make them particularly desirable, but other metals are also within the scope of this invention. The gold (or platinum) chlorosilicate, compound film is formed by the following method steps. A first alcohol solution of a gold chloride (or platinum chloride) is formed which contains a cross-linking agent in trace amounts. This first alcohol solution is mixed with a second alcohol solution containing an organic silicate. The first and second alcohol solutions are mixed, preferably in equal amounts by volume, and allowed to age for a specific length of time. It is believed that during this aging, a reaction is taking place between the chloride ions and the organo-silicate. The mixture thus formed can be applied by well known techniques including brushing, spraying or spinning and produces a film coat which quickly cross-links at room temperature to form a gold chloro-silicate glass which is then ready to be further treated.

Once the gold chloro-silicate glass is formed on a semiconductor surface, the semiconductor can be placed in a gold diffusion furnace for diffusing the gold into the silicon wafer. Under such heat, the film makes the final conversion into atomic gold and silica with a dense enough structure to permit free movement of the gold within the film. In this manner, improvements in the diffusion of the gold atoms into the surface of the semiconductor for lifetime control is achieved. To form a platinum film, the above procedual steps are repeated using platinum chloride. This salt forms a platinum chloro-silicate glass which is heated in order to drive the platinum into the silicon wafer.

The novel features which are believed to be characteristic of the invention, both as to its organization and method of operation, together with further objectives and advantages thereof, will be better understood from the following description in which a presently preferred embodiment of the invention is illustrated by way of example. It is to be expressly understood, however, that such preferred embodiment is for the purpose of illustration and description only and is not intended as a definition of the limits of the invention.

DESCRIPTION OF THE PREFERRED EMBODIMENT

This invention has been broadly described as a method for forming a metal-silica solution, as well as a method for utilizing such solution to form a glass film on semi-conductor device. It should be noted that this method has particular utility in forming a gold-organo-silica glass film or a platinum-organo-silicate glass film on silicon wafers which glass film is partially cross-linked. In this manner the wafers can be further treated without destroying the glass film.

In forming the gold-silica solution of the present invention a two-part system is used. Part A contains specific amounts of gold chloride in an alcohol solution. The alcohol is preferably a blend of ethyl, methyl and isopropyl alcohol which are selected to impart good flow-out characteristics. Of course, it is understood that other alcohol solvents may also be used. A preservative and cross-linking agent is also added to Part A in trace amounts and in the preferred embodiment, such preservative and cross-linking agent is hydrochloric acid. The gold chloride is completely dissolved in this alcohol forming gold ions and chlorine ions.

The second solution (Part B) is as follows:

Part B contains an organic silicate also in an alcohol solvent. In the preferred embodiment, tetra-ethyl-ortho-silicate is blended with ethyl and isopropyl alcohol.

To make the gold-silica solution of the present invention, Part A and Part B are mixed in equal amounts by volume and allowed to age for a specific length of time. Of course, other amounts of Part A and Part B can be utilized depending upon the method of application to the surface to be coated. If a thinner solution is desired more solvent is used and less tetra-ethyl-ortho-silicate. For example, ratios of 10:1 to 1:0 by volume of Part A: Part B are within the scope of this invention.

It should also be noted that in order to obtain the beneficial results such as ease of coating and the like, it is necessary that the mixture be aged a sufficient time. It has been found that the most advantageous results are obtained when a minimum of about two hours of aging is used. After such aging, the mixture may now be applied at room temperature to the desired surface by brushing, spraying or spinning such as is well known in the art. For example, the above-described mixture produces a film of about 1500 angstroms when spun-on which film quickly cross-links at room temperature to form a gold organo-silicate glass which is ready to use in less than five minutes. This room temperature formation of the glass is a point of novelty of the present invention and represents a distinct improvement over the prior art.

At this point, the semiconductor device can be transported to the furnace without worry of damage to the gold organo-silicate film. As is apparent from the relatively simple and inexpensive preparation of the above-identified solution mixture, no major equipment is required to form the solution. And because only alcohol solvents containing a gold salt and an organo-silicate are used, there is no gold-metal damage done to the silicon surface. Moreover, the film is easily removable from a semiconductor surface without the need for strong etchants. Thus, even after use of the mixture of the present invention, the silicon surface is almost totally free from visible pits, holes and dislocation crystal damage. The present method also enables a very uniform introduction of gold into the silicon surface to take place. Finally, performance is not film thickness dependent and variations of up to five to one in thickness ratios have not varied the advantageous results. It is to be understood that the use of other metal compounds and especially, platinum, can be used with the same methods of coating, heating and the like.

EXAMPLES OF THE PREFERRED EMBODIMENT

Make-up of a typical coating solution.
2 mls of gold chloride solution
  1. This solution is formed by making a 100 mls solution of gold chloride dissolved in water such that 1 oz of pure gold is present, i.e. sufficient gold ions to form 1 oz of free gold.
200 mls of reagent ethanol (95 weight % ethanol, 5 weight % isopropyl alcohol)
70 mls of tetra-ethyl-ortho-silicate
40 mls of methanol containing 1% by volume of concentrated (30 weight%) HCl The coating solution is formed from Part A and Part B as follows:
Part A: 2 ml of gold chloride solution
  115 ml of reagent ethanol
  40 ml of methanol and HCl
Part B: 85 ml of reagent ethanol
  70 ml of tetra-ethyl-ortho-silicate
Part A and Part B are mixed in equal amounts by volume.

The above example has been repeated utilizing platinum chloride and the results have been just as good. In addition, when a platinum film is being formed, 1 gram of chloro-platanic acid (platinum hexa-chloride) has been used and the water (used to make the 2 mls of gold chloride solution) is omitted.

While this invention has been described in its preferred embodiment, it is to be understood that the words which have been used are words of description rather than of limitation and that changes within the purview of the dependent claims may be made without departing from the true scope and spirit of the invention in its broader aspects. For example, it has been determined that other salts, and more specifically other chloride salt can be used in the present invention such as tin chloride, nickel chloride, and the like. In this manner other metal films can be formed on the desired surface. While it is not the intent to be limited to any specific theory, it is presently believed that a reaction takes place between the chloride ions and the tetra-ethyl-ortho-silicate causing the tetra-ethyl-ortho-silicate to partially cross-link. Other compounds which cause this cross-linking to take place are within the scope of this invention. When the solution is applied, a greater surface area is presented which allows the solvent to evaporate. This permits further cross-linking of the tetra-ethyl-ortho-silicate to take place so as to form the above described glass film.

As long as the cross-linking does not progress to any great extent, the coating solution can be used. Thus a usable shelf-life of 2 hours to a week have been achieved.

I claim:

1. A partially cross-linked metal chloro-silicate solution for coating semicondutor devices and the like produced by the steps of:
   (a) forming a mixture of:
      (i) a first alcohol solution of a platinum chloride and a chloride-ion producing cross-linking agent for tetraethylorthosilicate, and
      (ii) a second alcohol solution of tetraethylorthosilicate; and
   (b) aging said mixture a predetermined length of time so as to form a partially cross-linked tetraethylorthosilicate composition.

2. The solution of claim 1 wherein said cross-linking agent is hydrochloric acid.

3. The solution of claim 2 wherein the alcohol in the first alcohol solution is a mixture of ethyl alcohol, methyl alcohol and isopropyl alcohol, and the alcohol in the second alcohol solution is a mixture of ethyl alcohol and isopropyl alcohol.

4. The solution of claim 1 wherein said mixture is aged a minimum of approximately two hours.

5. The solution of claim 1 wherein the first and second alcohol solutions are mixed in approximately equal amounts by volume.

* * * * *